(12) United States Patent
Maa et al.

(10) Patent No.: US 6,746,902 B2
(45) Date of Patent: Jun. 8, 2004

(54) METHOD TO FORM RELAXED SIGE LAYER WITH HIGH GE CONTENT

(75) Inventors: Jer-Shen Maa, Vancouver, WA (US); Douglas James Tweet, Camas, WA (US); Sheng Teng Hsu, Camas, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 164 days.

(21) Appl. No.: 10/062,319

(22) Filed: Jan. 31, 2002

(65) Prior Publication Data

US 2003/0143783 A1 Jul. 31, 2003

(51) Int. Cl.$^7$ .......................... H01L 21/00; H01L 21/84
(52) U.S. Cl. ........................................ 438/149; 438/933
(58) Field of Search .................... 438/149, 933

(56) References Cited

U.S. PATENT DOCUMENTS

| | | | | |
|---|---|---|---|---|
| 5,891,769 A | * | 4/1999 | Liaw et al. | 438/167 |
| 6,326,667 B1 | * | 12/2001 | Sugiyama et al. | 257/347 |
| 6,464,780 B1 | | 10/2002 | Mantl et al. | 117/90 |
| 6,562,703 B1 | * | 5/2003 | Maa et al. | 438/518 |
| 6,573,126 B2 | * | 6/2003 | Cheng et al. | 438/149 |
| 6,583,000 B1 | * | 6/2003 | Hsu et al. | 438/222 |
| 2003/0140844 A1 | * | 7/2003 | Maa et al. | 117/4 |

OTHER PUBLICATIONS

Article entitled, "Defects in Epitaxsial Multilayers", by J. W. Matthews et al., published in Journal of Crystal Growth 27 (1974) pp 118–125.

Article entitled, "Nucleation of Misfit Dislocations in Strained–Layer Eitaxy in the GexSil–x/Si System", by R. Hull et al., published in J. Vac.Sci.Technol. A7(4), Jul-Aug 1989, pp. 2580–2585.

Article entitled, "Strain Dependence of the Performance Enhancement in Strained–Si n–MOSFETs" by J. Welser et al., published in 1994 IEEE, pp 373–376.

Article entitled, "Strain Relaxation Kinetics in Sil–xGex/Si Heterostructures", by D. C. Houghton., published in J. Appl. Phys. 70(4) Aug. 15, 1991 pp 2136–2151.

Letter to the Editor entitled, "High–Electron–Mobility Si/SiGe Heterostructures; Influence of the Relaxed SiGe Buffer Layer", by F. Schaffler et al., Semicond.Sci.Technol. 7(1992) pp 260–266.

Article entitled, "Investigation of Dislocations in Sil–xGex/Si Heterosructures Grown in LPCVD" by H.P. Tang et al., published in Journal of Crystal Growth 125(1992) pp 301–310.

Article entitled, "New Approach to the Growth of Low Dislocation Relaxed SiGe Material" by A.R. Powell et al, published in Appl. Phys. Lett. 64 (14), Apr. 4, 1994, pp 1856–1858.

(List continued on next page.)

Primary Examiner—John F. Niebling
Assistant Examiner—Angel Roman
(74) Attorney, Agent, or Firm—David C. Ripma; Matthew D. Rabdau

(57) ABSTRACT

A method of forming a SiGe layer having a relatively high Ge content includes preparing a silicon substrate; depositing a layer of SiGe to a thickness of between about 100 nm to 500 nm, wherein the Ge content of the SiGe layer is equal to or greater than 22%, by molecular weight; implanting H+ ions into the SiGe layer at a dose of between about $1 \cdot 10^{16}$ cm$^{-2}$ to $5 \cdot 10^{16}$ cm$^{-2}$, at an energy of between about 20 keV to 45 keV; thermal annealing the substrate and SiGe layer, to relax the SiGe layer, in an inert atmosphere at a temperature of between about 650° C. to 950° C. for between about 30 seconds and 30 minutes; and depositing a layer of tensile-strained silicon on the relaxed SiGe layer to a thickness of between about 5 nm to 30 nm.

13 Claims, 4 Drawing Sheets

OTHER PUBLICATIONS

Article entitled, "Relaxation of SiGe Thin Films Grown on Si/SiO2 Substrates" by F.K. LeGoues et al., published in J. Apl. Phys. 75(11), Jun. 1, 1994, pp 7240–7246.

Article entitled, "Fabrication and Analysis of Deep Submicron Strained–Si N–MOSFET's" by Kern (Ken) Rim et al., published in IEEE Transactions of Electron Devices, vol. 47, No. 7, Jul. 2000, pp 1406–1415.

Article entitled, "Strained Si NMOSFETs for High Performance CMOS Technology" by K. Rim et al., published in 2001 Symposium on VLSI Tech. Digest of Tech. Papers, pp 59–60.

Article entitled, "Enhanced Hole Mobilities in Surface–Channel Strained–Si p–MOSFETs" by K. Rim et al., published in IEDM, pp 517–520.

Article entitled, "High–Mobility Strained–Si PMOSFET's" by D. K. Nayak et al., published by IEEE Transactions on Electron Devices, vol. 43, No. 10, Oct. 1996, pp 1709–1715.

Article entitled, "Determination of the activation energy for the heterogeneous nucleation of misfit dislocations in $Si_{1-x}Ge_x$/Si deposited by selective epitaxy", by S. Wickenhauser et al., published in Appl. Phys. Lett, 70 (3), Jan. 20, 1997, pp 324–326.

Article entitled, "Totally relaxed $Ge_xSi_{1-x}$ layers with low threading dislocation densities grown on Si substrates", by E. A. Fitzgerald, published in Appl. Phys. Lett. 59(7), Aug. 12, 1991, pp 811–813.

Article entitled, "Cavity–dislocation interactions in Si–Ge and implications for heterostructure relaxation", by D. M. Follstaedt, published in Appl. Phys. Lett. 69 (14), Sep. 30, 1996.

Article entitled, "On the mechanism of the hydrogen–induced exfoliation of silicon" by M. K. Weldon published in J. Vac. Sci. Technol. B 15(4), Jul/Aug 1997, pp 1065–1073.

Article entitled, "Strain relaxation of eiptaxial SiGe layers on Si(100) improved by hydrogen implantation" by S. Mantl published in Nuclear Instruments and Methods in Physics Research B 147 (1999) pp 29–34.

Article entitled, "Strain relaxation mechanism for hydrogen– implanted $Si_{1-x}Ge_x$/Si(100) heterostructures" by H. Trinkaus et al., published in Applied Physics Letters, vol. 76, #24, Jun. 12, 2000, pp 3552–3554.

Article entitled, "Relaxation of $Si_{1-x}Ge_x$ Buffer Layers on Si(100) Through the Helium Implantation" by M. Luysberg et al., published in 2001 Spring MRS Abstracts, pp 301.

* cited by examiner

METHOD TO FORM RELAXED SIGE LAYER WITH HIGH GE CONTENT

RELATED APPLICATIONS

This application is related to Ser. No. 09/541,255, filed Apr. 3, 2000, for Method to Form Thick Relaxed SiGe Layer on Si, and Ser. No. 09/783,817, filed Feb. 13, 2001, for Method of Reducing $Si_{1-x}Ge_x$ CMOS Leakage Current.

FIELD OF THE INVENTION

This invention relates to high speed CMOS integrated circuits, and specifically to a method to form a SiGe layer with hydrogen implantation.

BACKGROUND OF THE INVENTION

In enhanced mobility MOSFET device applications thick, relaxed $Si_{1-x}Ge_x$ buffer layers have been used as virtual substrates for thin strained silicon layers to increase carrier mobility for both nMOS devices Welser et al, *Strain dependence of the performance enhancement in strained-Si n-MOSFETs*, IEDM Conference Proceedings, p. 373 (1994); Rim et al., *Fabrication and analysis of Deep submicron strained-Si N-MOSFETs*, IEEE Transactions on Electron Devices, Vol 47, 1406, (2000); and Rim et al, *Strained Si NMOSFETs for high performance CMOS technology,* 2001 Symposium on VLSI Technology Digest of Technical Papers, p. 59, IEEE 2001; and pMOS devices, Rim et al, *Enhanced hole mobilities in surface-channel strained-Si p-MOSFETs*, IEDM Conference Proceedings, p. 517 (1995); and Nayak et al, *High-mobility Strained-Si PMOSFETs*, IEEE Transactions on Electron Devices, Vol. 43, 1709 (1996). Compared with bulk silicon devices, enhancement in electron mobility of 70% for devices with Leff<70 nm has been reported by Rim et al., 2001. Enhancements of up to 40% in high-field hole mobility for long-channel devices have also been found by Nayak et al.

Thick $Si_{1-x}Ge_x$ layers relax plastically by the formation of misfit dislocations, R. Hull et al., *Nucleation of misfit dislocations in strained-layer epitaxy in the $Ge_xSi_{1-x}/Si$ system*, J. Vac Sci. Technol., A7, 2580, 1989; Houghton, *Strain relaxation kinetics in $Si_{1-x}Ge_x/Si$ heterostructures*, J. Appl. Phys., 70, 2136, 1991; Wickenhauser et al., *Determination of the activation energy for the heterogeneous nucleation of misfit dislocations in $Si_{1-x}/Ge_x/Si$ deposited by selective epitaxy*, Appl. Phys. Lett., 70, 324, 1997; Matthews et al., *Defects in epitaxial multilayers*, J. Cryst. Growth, 27, 118, 1974; and Tang et al., *Investigation of dislocations in $Si_{1-x}Ge_x/Si$ heterostructures grown by LPCVD*, J. Cryst. Growth, 125, 301, 1992. During this process threading dislocations usually are created. The existence of threading dislocations degrades device performance and reduces device yield significantly.

The current state of the art technique to fabricate a high quality relaxed $Si_{1-x}Ge_x$ buffer layer is the growth of a several μm thick compositionally graded layer Rim et al., 2000; Nayak et al.; Schäffler et al., *High-electron-mobility Si/SiGe heterostructures: influence of the relaxed SiGe buffer layer*, Semiconductor. Sci. Technol., 7. 260, 1992; and Fitzgerald et al., *Totally relaxed $Ge_xSi_{1-x}$ layers with low threading dislocation densities grown on Si substrates*, Appl. Phys. Lett., 59, 811, 1991. However, the density of threading dislocations is still high, e.g., typically >106 $cm^{-2}$. In addition, the integration of a several μm thick $Si_{1-x}Ge_x$ layer into commercial viable device fabrication is not practical. The relaxation of SiGe grown on Separation by IMplantation of Oxygen (SIMOX) wafers has also been investigated, in this case the Si/SiGe bilayer behaves as a free-floating foil constrained to remain flat by the substrate. However, the ratio of thicknesses between the silicon and SiGe layers must be precisely controlled to move the nucleation and glide of dislocations from the SiGe layer to the silicon layer. Also, this technique needs to be extended to include higher Ge content to have utility for most technological applications, LeGouse et al., *Relaxation of SiGe thin films grown on Si/SiO$_2$ substrates*, J. Appl. Phys. 75 (11) 1994. Powell et al, *New approach to the growth of low dislocation relaxed SiGe material*, Appl. Phys. Lett., vol. 64, 1856 (1994).

Cavities formed in silicon and Ge and their alloys by helium implantation and annealing were found to have a strong short-range, attractive interaction with dislocations. Introducing cavities at the SiGe/Si interface greatly enhances the relaxation rate and alters dislocation microstructures. However, reduction of threading dislocation density has not been observed, Follstaedt et al., *Cavity-dislocation interactions in Si-Ge and implications for heterostructure relaxation*, Appl. Phys. Lett., 69, 2059, 1996. To achieve an 80% relaxation, a one hour anneal at about 1000° C. is required.

Hydrogen implantation has been reported to induce exfoliation of silicon and cause shearing of macroscopic layers of silicon, Weldon et al, *On the mechanism of the hydrogen-induced exfoliation of silicon*, J. Vac. Sci. Technol. B. 15, 1065, 1997. This was applied to the fabrication of high-quality silicon-on-insulator (SOI) wafers, and is known as the SmartCut™ process. Recent publications by a German collaboration, S. Mantl et al. and H. Trinkaus et al., have reported the advantages of using hydrogen implantation to increase the degree of SiGe relaxation and to reduce the density of threading dislocation, S. Mantl et al, *Strain relaxation of epitaxial SiGe layers on Si(100) improved by hydrogen implantation*, Nuclear Instruments and Methods in Physics Research B 147, 29, (1999), and H. Trinkaus et al, *Strain relaxation mechanism for hydrogen-implanted $Si_{1-x}Ge_x/Si(100)$ heterostructures*, Appl. Phys. Lett., 76, 3552, 2000. However, the researchers reported the relaxation of a SiGe layer having a thickness of only 2000 Å to 2500 Å, having a Ge concentration, by molecular weight, of less than 22% Ge. SiGe of such thickness is not sufficient for commercial device applications. A method for making thicker films is disclosed in related application Ser. No. 09/541,255, while a method reducing leakage current through proper isolation is disclosed in related application Ser. No. 09/783, 817. Related application Ser. No. 09/541,255 describes fabrication of SiGe thin films with about 21% Ge. A higher Ge content is desirable in order to increase the strain in the cap silicon channel and so to farther improve the electron and hole mobility.

The German collaboration has reported that helium implantation is effective in creating highly relaxed SiGe layers with up to 30% Ge, M. Luysberg et al., *Relaxation of $Si_{1-x}Ge_x$ buffer layers on Si(100) through Helium implantation*, Abstracts of the 2001 MRS Spring Meeting, Abstract P5.4, Apr. 18, 2001. During the oral presentation of that paper, it was specifically reported that 80% relaxation was achieved on a 100 nm thick SiGe layer with 30% Ge content through implantation of 18 keV Helium ions at a dose of $1 \cdot 10^{16}$ $cm^{-2}$ to $3 \cdot 10^{16}$ $cm^{-2}$, and a RTA of 750° C. to 1000° C. The speaker specifically stated that hydrogen implantation does not work for films with Ge content greater than 22%. In order to produce a smooth, 100 nm to 500 nm thick layer of relaxed SiGe having a Ge content greater than 22%, it was reported that helium implantation is necessary, and that hydrogen implantation does not work.

SUMMARY OF THE INVENTION

A method of forming a SiGe layer having a relatively high Ge content includes preparing a silicon substrate; depositing a layer of SiGe to a thickness of between about 100 nm to 500 nm, wherein the Ge content of the SiGe layer is equal to or greater than 22%, by molecular weight; implanting H+ ions into the SiGe layer at a dose of between about $1 \cdot 10^{16}$ cm$^{-2}$ to $5 \cdot 10^{16}$ cm$^{-2}$, at an energy of between about 20 keV to 45 keV; thermal annealing the substrate and SiGe layer, to relax the SiGe layer, in an inert atmosphere at a temperature of between about 650° C. to 950° C. for between about 30 seconds and 30 minutes; and depositing a layer of tensile-strained silicon on the relaxed SiGe layer to a thickness of between about 5 nm to 30 nm.

The objective of this invention is to produce a thick, e.g., 100 nm to 500 nm, relaxed, smooth SiGe film with high Ge content (>22%) as a buffer layer for a tensile strained silicon film to be used for high speed MOSFET applications.

This summary and objectives of the invention are provided to enable quick comprehension of the nature of the invention. A more thorough understanding of the invention may be obtained by reference to the following detailed description of the preferred embodiment of the invention in connection with the drawings.

DETAILED DESCRIPTION OF THE PREFERRED EMBODIMENT

This disclosure demonstrates that, contrary to the teachings of the prior art, hydrogen implantation is very effective in producing highly relaxed SiGe films having a Ge content greater than 22%. The techniques described herein are performed on SiGe films having Ge concentrations greater than 22%, however, there is no indication of an upper boundary for Ge concentration using the method of the invention. Furthermore, for commercial device applications, hydrogen implantation is preferable to helium because helium is unable to passivate defects, while hydrogen is well known to be able to passivate defects. The method of the invention uses hydrogen implantation to generate a thick, e.g., 100 nm to 500 nm thick, relaxed, smooth SiGe film having a high Ge content (>22%) and having low threading dislocation density.

Figure 1:
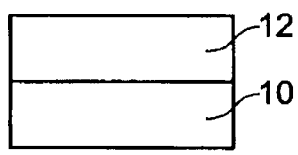
FIGS. 1–5 depicts the SiGe deposition method of the invention.

The method of the invention is described, beginning with FIG. 1. A silicon substrate 10, which may be bulk silicon or Separation by IMplantation of Oxygen (SIMOX), is prepared. A layer of strained SiGe 12, having a thickness of between about 100 nm to 500 nm is deposited on substrate 10. The Ge content of layer 12 may 22% or greater, by atomic ratio. As previously noted, the preferred embodiment of the method of the invention produces a SiGe layer of about 30% Ge concentration. Alternatively, a graded Ge profile may be used. The growth conditions and source gases should be chosen to minimize surface roughness while ensuring good crystallinity. This usually means low temperature growth, e.g., 400° C. to 600° C., to produce a metastable, strained SiGe film.

Figure 2:
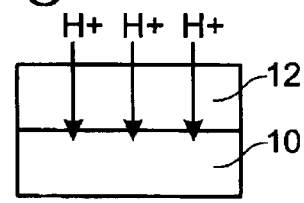

Turning to FIG. 2, H+ ions are implanted. The dose of H+ is in the range of between about $1 \cdot 10^{16}$ cm$^{-2}$ to $5 \cdot 10^{16}$ cm$^{-2}$. The energy levels depends on SiGe thickness, but are typically in the range of between about 20 keV to 45 keV. To avoid contamination during the implantation step, a thin sacrificial silicon oxide layer, in the range of between about 50 Å to 300 Å may be deposited on the SiGe layer 12.

Figure 3:
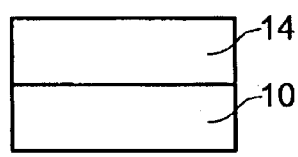
Figure 4:
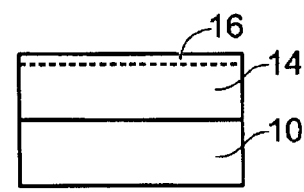

FIG. 3 depicts a thermal annealing step, which converts strained SiGe layer 12 to a first relaxed SiGe layer 14. Annealing is performed in an inert ambient atmosphere, such as Ar, at a temperature in the range of between about 650° C. to 950° C., for between about 30 seconds and 30 minutes.

If needed, an option, second layer 16 of relaxed SiGe is deposited to a thickness of about 100 nm or greater on SiGe layer 14. The criteria for determining whether this optional layer is necessary is the thickness of SiGe layer 14. If layer 14 is less than 300 nm thick, an additional relaxed SiGe layer is required to bring the final SiGe relaxed layer thickness to at least 300 nm.

Figure 5:
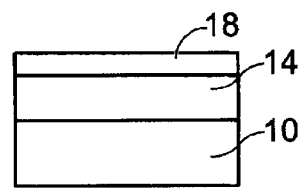

The final step of the method of the invention is depicted in FIG. 5, wherein a layer of tensile-strained silicon 18, having a thickness of between about 5 nm to 30 nm, is deposited on relaxed SiGe layer 14 or 16.

Figure 6:
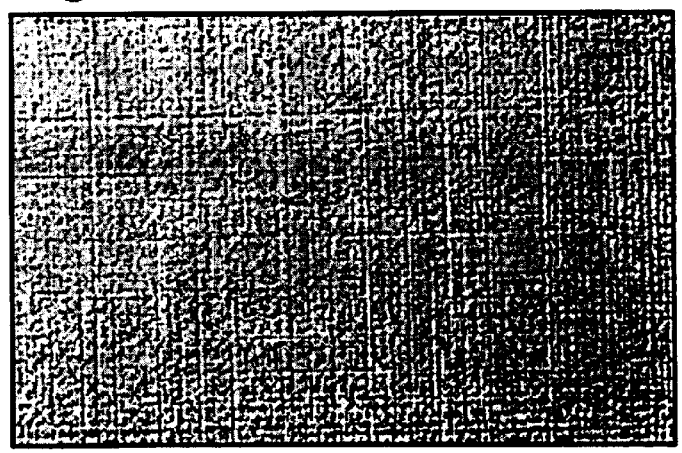
FIG. 6 depicts a Nomarski image of a 200 nm to 220 nm thick SiGe films having a Ge concentration of between about 28–30% after hydrogen implantation and thermal relaxation.
Figure 7:
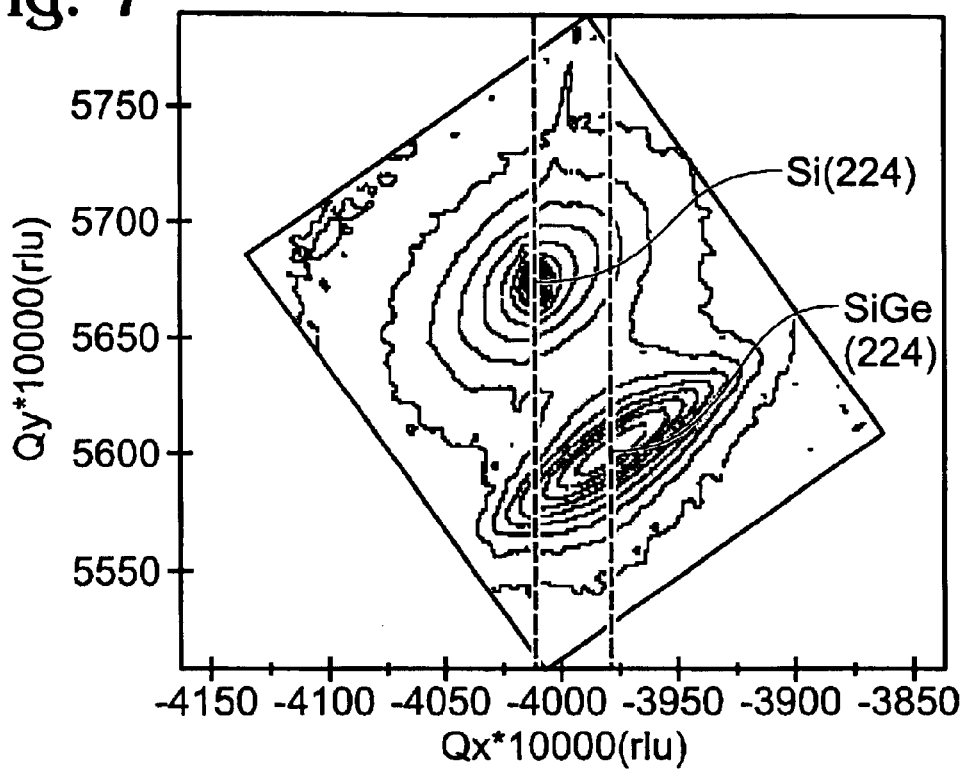
FIG. 7 depicts an X-ray diffraction of the wafer of FIG. 6.
Figure 8:
FIG. 8 depicts a Nomarski image of a 300 nm thick SiGe film with a graded Ge profile after hydrogen implantation and annealing at 400×.
Figure 9:
FIG. 9 depicts a Nomarski image of a 300 nm thick SiGe film with a graded Ge profile after hydrogen implantation and annealing at 1000×.
Figure 10:
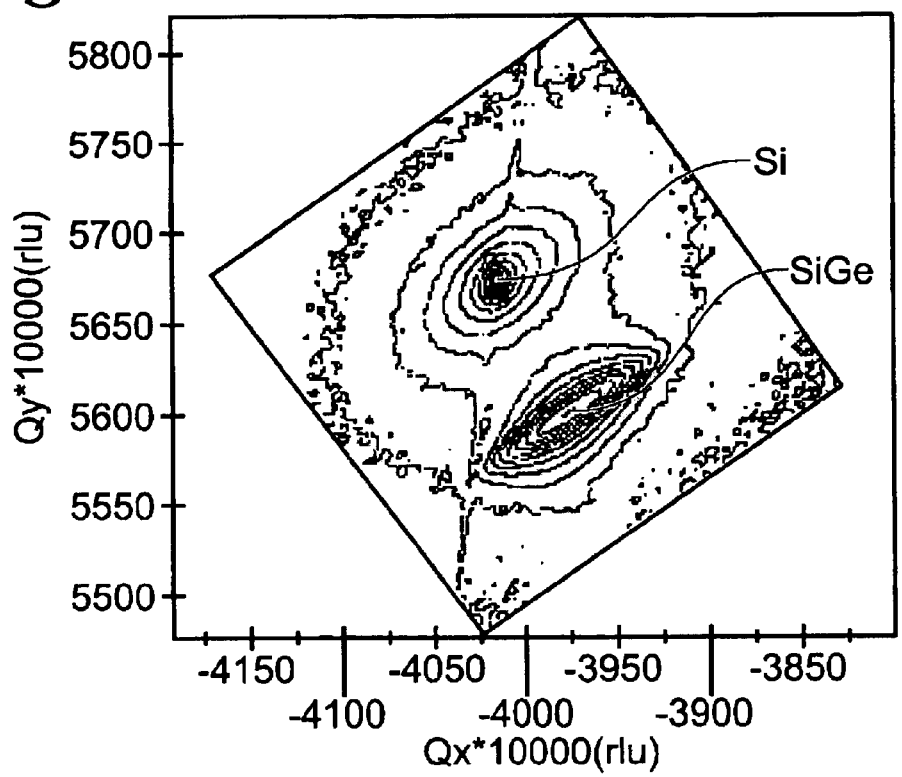
FIG. 10 depicts an X-ray diffraction of the SiGe layer of FIGS. 8 and 9.

For example, FIGS. 6, 7 and 8–10 depict 200 nm to 220 nm thick SiGe films having between about 25% to 30% Ge content after hydrogen implantation and thermal relaxation. Nomarski images, FIGS. 6, 8 and 9, depict a very flat surface morphology. FIGS. 7 and 10 depict X-ray diffraction reciprocal space maps, which confirm that the crystal lattice is highly relaxed, at least 70% up to 85%. Referring to FIG. 7, this relaxed state is indicated by the offset between the silicon (224) peak and the SiGe (224) peak, as indicated by the dashed lines.

Figure 11:
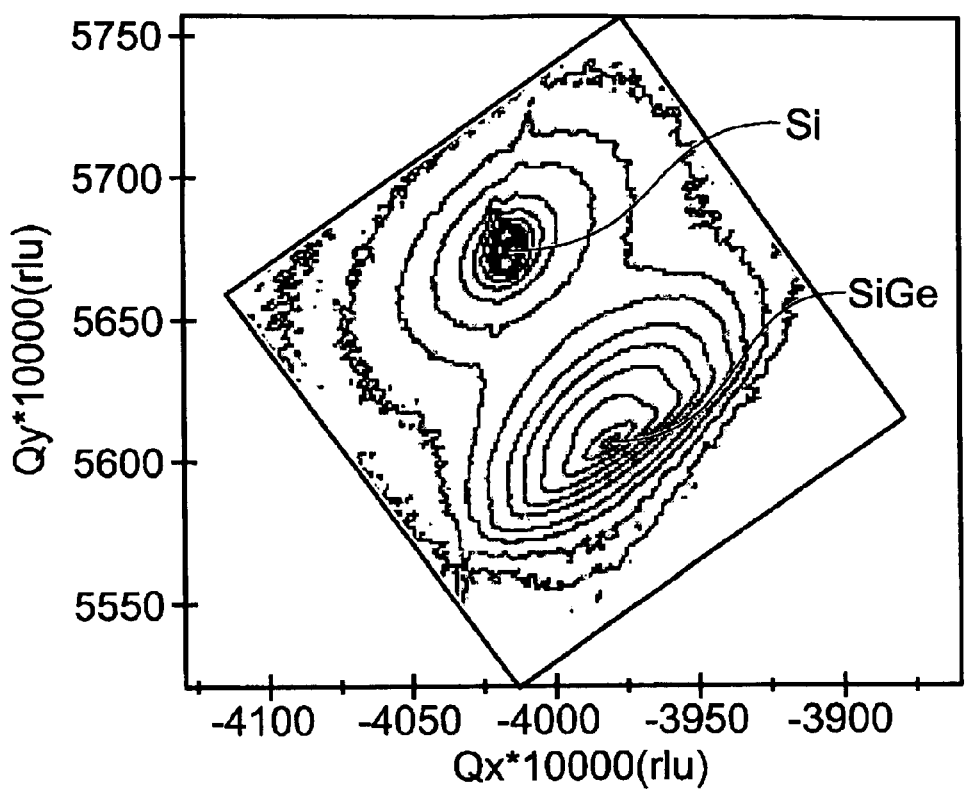
FIG. 11 depicts an X-ray diffraction of a 300 nm thick SiGe layer fabricated with a graded profile.
Figure 12:
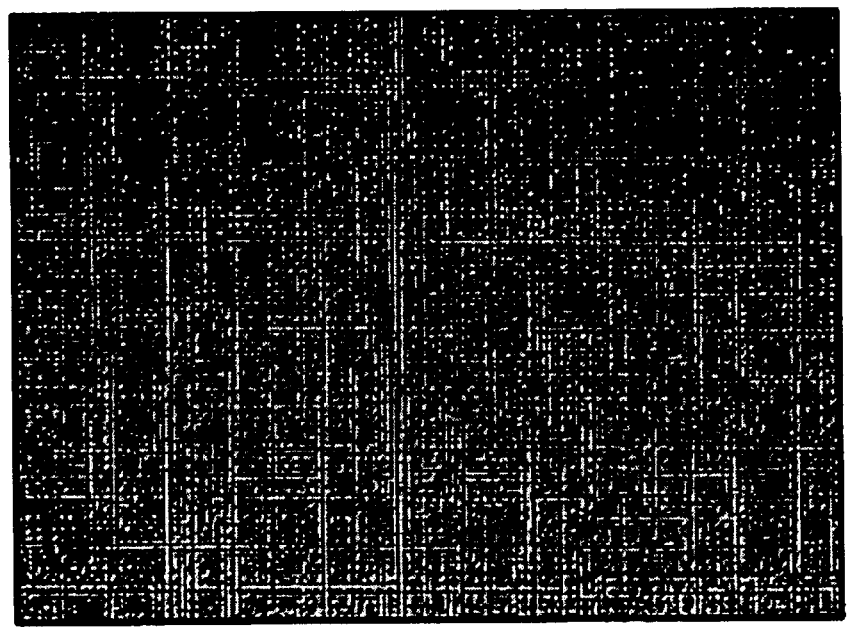
FIG. 12 is a Nomarski image of the 300 nm thick SiGe layer of FIG. 11, at 1000×.

FIG. 11 depicts a Nomarski image of a SiGe film having a thickness of about 300 nm, with a graded Ge profile after hydrogen implantation and annealing. FIG. 12 depicts an X-ray diffraction of the SiGe layer of FIG. 11. The Ge content varies approximately linearly from 21% at the silicon substrate to 30% at the surface. Using of a graded Ge profile facilitates an increase of the SiGe film thickness and still provides a highly relaxed film with a smooth surface. This film is thick enough that a second SiGe deposition is generally not required, thereby improving the overall film quality.

All of the relaxed films constructed according to the method of the invention may be used as substrates for the growth of tensile-strained silicon films. These may then be used to fabricate NMOS and pMOS transistors with enhanced hole and electron mobility. The SiGe thin film of FIGS. 6 and 7 has a Ge concentration of 28.6%. It is about 200 nm thick, and is fabricated with an H+ ion implantation at an energy of about 25 keV, and an ion dose of about $3 \cdot 10^{16}$ cm$^{-2}$. The wafer is annealed at about 800° C. for about ten minutes in an RTA chamber in an argon atmosphere. The Nomarski image is at 1000×, and depicts a rather smooth surface. The X-ray diffraction reciprocal space map of FIG. 7 shows a large, central peak, which is the silicon (−2-24) substrate peak. The smaller peak below and to the right is from the partially relaxed SiGe film. From the relative positions of these two peaks, the SiGe film has 28.2%±0.5% Ge, and is 75.8%±3% relaxed.

FIGS. 8, 9 and 10 depict a highly relaxed, e.g., about 85%, smooth first SiGe film, having about 30% Ge concentration. This example has a Ge concentration of about 30% in the SiGe film, which is about 220 nm thick. A SiO$_2$ cap of about 20 nm is formed by PECVD. H+ ion implantation is at an energy of about 26 keV, and an ion dose of about $3 \cdot 10^{16}$ cm$^{-2}$. The wafer is annealed at about 800° C. for nine minutes in a RTA chamber in an Argon atmosphere. FIG. 9 depicts a Nomarski image at 400× taken at the wafer center. FIG. 9 is the same wafer Nomarski image at 1000×, also taken at the wafer center. FIG. 10 depicts the X-ray diffraction of the wafer, which demonstrates that the SiGe film has a Ge concentration of 29.7%±0.5%, and is 85.2%±3% relaxed.

FIGS. 11 and 12 depict a highly relaxed, graded Ge sample with a smooth surface. FIG. 11 is an X-ray diffraction depicting a highly relaxed, e.g., about 82%, smooth first SiGe film. The SiGe layer is about 301 nm thick, and has a Ge grade profile of about 21%–30% as grown. H+ ion implantation is at an energy level of about 32 keV, and at an ion dose of about $2 \cdot 10^{16}$ cm$^{-2}$. The wafer is annealed at about 800° C. for about nine minutes in an RTA chamber in an Argon atmosphere. The SiGe film has a Ge concentration of 27.8%±0.5%, and is 82.2%±3% relaxed. The Nomarski image of FIG. 12 is of the wafer center at 1000×.

Alternate Embodiments

The method of the invention may be modified by the growth of more than a 300 nm thick layer of SiGe, with a graded Ge profile having a Ge content at the surface of greater than 22%+H-II+RTA (to relax the SiGe layer)+ tensile epi-silicon cap/channel. This does not require deposition of a second SiGe layer.

Another embodiment of the method of the invention includes growth of a first SiGe layer, with either constant or graded Ge profile, +H-II+RTA (to relax the SiGe layer)+a second SiGe layer, with either constant or graded Ge profile having Ge content at surface greater than 22%+tensile epi-silicon cap/channel. Total SiGe layer thickness in this embodiment of the method of the invention should be 300 nm or greater.

Thus, a method to form a relaxed SiGe layer with a high Ge concentration has been disclosed. It will be appreciated that further variations and modifications thereof may be made within the scope of the invention as defined in the appended claims.

We claim:

1. A method of forming a SiGe layer having a relatively high Ge content, comprising:

preparing a silicon substrate;

depositing a layer of SiGe to a thickness of between about 100 nm to 500 nm, wherein the Ge content of the SiGe layer is equal to or greater than 22%, by molecular weight;

implanting H+ ions into the SiGe layer at a dose of between about $1 \cdot 10^{16}$ cm$^{-2}$ to $5 \cdot 10^{16}$ cm$^{-2}$, at an energy of between about 20 keV to 40 keV;

thermal annealing the substrate and SiGe layer, to relax the SiGe layer, in an inert atmosphere at a temperature of between about 650° C. to 950° C. for between about 30 seconds and 30 minutes; and depositing a layer of tensile-strained silicon on the relaxed SiGe layer to a thickness of between about 5 nm to 30 nm.

2. The method of claim 1 wherein said depositing a layer of SiGe includes depositing the layer of SiGe at a temperature of between about 400° C. to 600° C.

3. The method of claim 1 which further includes, prior to said implanting, depositing a layer of silicon oxide on the SiGe layer to a thickness of between about 50 Å to 300 Å.

4. The method of claim 1 which further includes, after said thermal annealing, depositing a layer of relaxed SiGe having a thickness of about 100 nm on the relaxed SiGe layer.

5. The method of claim 1 wherein said thermal annealing is done in an argon atmosphere.

6. A method of forming a SiGe layer having a relatively high Ge content, comprising:

preparing a silicon substrate, wherein the silicon substrate is taken from the group of substrates consisting of bulk silicon and SIMOX;

depositing a layer of SiGe to a thickness of between about 100 nm to 500 nm, wherein the Ge content of the SiGe layer is equal to or greater than 25%, by molecular weight, and where said depositing is done at a temperature in a range of between about 400° C. and 600° C.;

implanting H+ ions into the SiGe layer at a dose of between about $1 \cdot 10^{16}$ cm$^{-2}$ to $5 \cdot 10^{16}$ cm$^{-2}$, at an energy of between about 20 keV to 45 keV;

thermal annealing the substrate and SiGe layer, to relax the SiGe layer, in an argon atmosphere at a temperature of between about 650° C. to 950° C. for between about 30 seconds and 30 minutes; and depositing a layer of tensile-strained silicon on the relaxed SiGe layer to a thickness of between about 5 nm to 30 nm.

7. The method of claim 6 which further includes, prior to said implanting, depositing a layer of silicon oxide on the SiGe layer to a thickness of between about 50 Å to 300 Å.

8. The method of claim 6 which further includes, after said thermal annealing, depositing a layer of relaxed SiGe having a thickness of about 100 nm on the relaxed SiGe layer if the relaxed SiGe layer is less than 300 nm thick.

9. A method of forming a SiGe layer having a relatively high Ge content, comprising:

preparing a silicon substrate;

depositing a layer of SiGe to a thickness of between about 100 nm to 500 nm, wherein the Ge content of the SiGe layer is equal to or greater than 22%, by molecular weight, and at a temperature in a range of between about 400° C. to 600° C.;

implanting H+ ions into the SiGe layer at a dose of between about $1 \cdot 10^{16}$ cm$^{-2}$ to $5 \cdot 10^{16}$ cm$^{-2}$, at an energy of between about 20 keV to 45 keV;

thermal annealing the substrate and SiGe layer, to highly relax the SiGe layer to a relaxation of at least 70%, in an inert atmosphere at a temperature of between about 650° C. to 950° C. for between about 30 seconds and 30 minutes; and depositing a layer of tensile-strained silicon on the relaxed SiGe layer to a thickness of between about 5 nm to 30 nm.

10. The method of claim 9 which further includes, prior to said implanting, depositing a layer of silicon oxide on the SiGe layer to a thickness of between about 50 Å to 300 Å.

11. The method of claim 9 wherein said thermal annealing is done in an argon atmosphere.

12. The method of claim 9 which further includes, after said thermal annealing, depositing a layer of relaxed SiGe having a thickness of about 100 nm on the relaxed SiGe layer.

13. The method of claim 12 wherein said depositing a layer of relaxed SiGe having a thickness of about 100 nm on the relaxed SiGe layer is done only if the relaxed SiGe layer is less than 300 nm thick.

\* \* \* \* \*